(12) United States Patent
Miller et al.

(10) Patent No.: US 9,671,889 B1
(45) Date of Patent: Jun. 6, 2017

(54) INPUT MEMBER WITH CAPACITIVE SENSOR

(71) Applicant: Apple Inc., Cupertino, CA (US)

(72) Inventors: Thayne M. Miller, Cupertino, CA (US); Jean-Marie Bussat, Cupertino, CA (US); Steven P. Hotelling, Cupertino, CA (US); Sawyer I. Cohen, Cupertino, CA (US); Tyler B. Cater, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 291 days.

(21) Appl. No.: 14/340,138

(22) Filed: Jul. 24, 2014

Related U.S. Application Data

(60) Provisional application No. 61/858,606, filed on Jul. 25, 2013.

(51) Int. Cl.
*G06K 9/00* (2006.01)
*G06F 3/041* (2006.01)
*G06F 3/044* (2006.01)

(52) U.S. Cl.
CPC .......... *G06F 3/0414* (2013.01); *G06F 3/044* (2013.01); *G06F 2203/04105* (2013.01); *G06F 2203/04106* (2013.01)

(58) Field of Classification Search
CPC ............ G06F 3/0414; G01N 21/9501; G01N 21/95607; G01N 23/2251
USPC ........................................................ 382/124
See application file for complete search history.

(56) References Cited

U.S. PATENT DOCUMENTS

| 4,527,862 | A | | 7/1985 | Arakawa |
| 5,343,064 | A | | 8/1994 | Spangler et al. |
| 6,002,389 | A | | 12/1999 | Kasser |
| 6,079,282 | A | | 6/2000 | Lanter |
| 6,154,580 | A | * | 11/2000 | Kuriyama ............ G06K 9/0002 250/556 |
| 6,323,846 | B1 | | 11/2001 | Westerman et al. |
| 6,545,495 | B2 | | 4/2003 | Warmack et al. |

(Continued)

FOREIGN PATENT DOCUMENTS

| CN | 1577385 | 2/2005 |
| CN | 1582453 | 2/2005 |

(Continued)

OTHER PUBLICATIONS

Engineers Edge, Common Plastic Molding Design Material Specification, 2015, http://www.engineersedge.com/plastic/materials_common_plastic.htm, 3 pages.

(Continued)

*Primary Examiner* — Ruiping Li
(74) *Attorney, Agent, or Firm* — Brownstein Hyatt Farber Schreck, LLP

(57) ABSTRACT

Input members with capacitive sensors are disclosed. In one embodiment of an electronic button, a first circuit is configured to capture a fingerprint of a user's finger placed on the electronic button, and a second circuit is configured to sense a force applied to the electronic button by the user's finger. The first circuit is further configured to provide temperature information to compensate for temperature sensitivities of the second circuit, and the second circuit is further configured to provide force information to the first circuit.

10 Claims, 14 Drawing Sheets

(56) References Cited

U.S. PATENT DOCUMENTS

| | | | |
|---|---|---|---|
| 6,568,275 B2 | 5/2003 | Scholz et al. |
| 6,570,557 B1 | 5/2003 | Westerman et al. |
| 6,570,707 B1 | 5/2003 | Murakami |
| 6,677,932 B1 | 1/2004 | Westerman |
| 6,989,728 B2 | 1/2006 | Van Zeeland et al. |
| 7,158,122 B2 | 1/2007 | Roberts |
| 7,211,885 B2 | 5/2007 | Nordal et al. |
| 7,511,702 B2 | 3/2009 | Hotelling |
| 7,538,760 B2 | 5/2009 | Hotelling et al. |
| 7,609,178 B2 | 10/2009 | Son et al. |
| 7,719,522 B2 | 5/2010 | Lyon et al. |
| 7,784,366 B2 | 8/2010 | Daverman et al. |
| 7,920,134 B2 | 4/2011 | Krah |
| 7,920,225 B2 | 4/2011 | Nishikawa et al. |
| 8,072,437 B2 | 12/2011 | Miller et al. |
| 8,169,332 B2 | 5/2012 | Son |
| 8,169,416 B2 | 5/2012 | Han |
| 8,253,711 B2 | 8/2012 | Kim et al. |
| 8,274,495 B2 | 9/2012 | Lee |
| 8,334,849 B2 | 12/2012 | Murphy et al. |
| 8,351,993 B2 | 1/2013 | Nunes |
| 8,390,481 B2 | 3/2013 | Pance et al. |
| 8,421,978 B2 | 4/2013 | Wang et al. |
| 8,436,823 B2 | 5/2013 | Kanehira et al. |
| 8,547,350 B2 | 10/2013 | Anglin et al. |
| 8,577,289 B2 | 11/2013 | Schlub et al. |
| 8,577,644 B1 | 11/2013 | Ksondzyk et al. |
| 8,633,916 B2 | 1/2014 | Bernstein et al. |
| 8,638,316 B2 | 1/2014 | Badaye et al. |
| 8,669,963 B2 | 3/2014 | Baker et al. |
| 8,711,122 B2 | 4/2014 | Wada et al. |
| 8,743,083 B2 | 6/2014 | Zanone et al. |
| 8,760,413 B2 | 6/2014 | Peterson et al. |
| 8,780,055 B2 | 7/2014 | Marchand et al. |
| 8,830,205 B2 | 9/2014 | Chang et al. |
| 8,922,523 B2 | 12/2014 | Lynch et al. |
| 8,963,874 B2 | 2/2015 | Li et al. |
| 9,001,080 B2 | 4/2015 | Okayama et al. |
| 9,024,907 B2 | 5/2015 | Bolender |
| 9,030,440 B2 | 5/2015 | Pope et al. |
| 9,057,653 B2 | 6/2015 | Schediwy et al. |
| 9,086,768 B2 | 7/2015 | Elias et al. |
| 9,088,282 B2 | 7/2015 | Holenarsipur et al. |
| 9,092,129 B2 | 7/2015 | Abdo et al. |
| 9,116,569 B2 | 8/2015 | Stacy et al. |
| 9,229,587 B2 | 1/2016 | Kawaguchi et al. |
| 9,262,002 B2 | 2/2016 | Momeyer et al. |
| 9,354,752 B2 | 5/2016 | Kanehira et al. |
| 9,375,874 B2 | 6/2016 | Lin et al. |
| 9,411,458 B2 | 8/2016 | Worfolk et al. |
| 9,430,102 B2 | 8/2016 | Prest et al. |
| 9,454,268 B2 | 9/2016 | Badaye et al. |
| 2006/0197753 A1 | 9/2006 | Hotelling |
| 2007/0272919 A1 | 11/2007 | Mori et al. |
| 2009/0015564 A1 | 1/2009 | Ye et al. |
| 2009/0066345 A1 | 3/2009 | Klauk et al. |
| 2009/0237374 A1 | 9/2009 | Li et al. |
| 2010/0117989 A1 | 5/2010 | Chang |
| 2010/0123686 A1* | 5/2010 | Klinghult .............. G06F 3/0412 345/178 |
| 2010/0128002 A1 | 5/2010 | Stacy et al. |
| 2010/0220065 A1 | 9/2010 | Ma |
| 2011/0012845 A1 | 1/2011 | Rothkopf et al. |
| 2011/0037706 A1 | 2/2011 | Pasquero et al. |
| 2011/0080373 A1 | 4/2011 | Wang et al. |
| 2011/0096013 A1 | 4/2011 | Krumpelman et al. |
| 2011/0227866 A1 | 9/2011 | Kawaguchi et al. |
| 2011/0227872 A1 | 9/2011 | Huska et al. |
| 2011/0235156 A1 | 9/2011 | Kothari et al. |
| 2011/0248941 A1 | 10/2011 | Abdo et al. |
| 2012/0038577 A1 | 2/2012 | Brown et al. |
| 2012/0086669 A1 | 4/2012 | Kim et al. |
| 2012/0089348 A1 | 4/2012 | Perlin et al. |
| 2012/0090757 A1 | 4/2012 | Buchan et al. |
| 2012/0098760 A1 | 4/2012 | Chuang |
| 2012/0105358 A1 | 5/2012 | Momeyer et al. |
| 2012/0169612 A1 | 7/2012 | Alameh et al. |
| 2012/0188202 A1 | 7/2012 | Tsujino et al. |
| 2012/0274602 A1 | 11/2012 | Bita et al. |
| 2012/0313863 A1 | 12/2012 | Hsu |
| 2012/0319987 A1 | 12/2012 | Woo |
| 2013/0076375 A1 | 3/2013 | Hanumanthaiah et al. |
| 2013/0113732 A1 | 5/2013 | Kang et al. |
| 2013/0176270 A1 | 7/2013 | Cattivelli et al. |
| 2013/0234977 A1 | 9/2013 | Lin |
| 2013/0328575 A1 | 12/2013 | Ra et al. |
| 2014/0085247 A1 | 3/2014 | Leung et al. |
| 2014/0111953 A1 | 4/2014 | McClure et al. |
| 2015/0071509 A1 | 3/2015 | Myers |
| 2015/0135108 A1 | 5/2015 | Pope et al. |
| 2015/0185946 A1 | 7/2015 | Fourie |
| 2016/0042166 A1* | 2/2016 | Kang ..................... G06F 21/32 726/7 |
| 2016/0378255 A1 | 12/2016 | Butler et al. |

FOREIGN PATENT DOCUMENTS

| | | |
|---|---|---|
| CN | 1707415 | 12/2005 |
| CN | 1714336 | 12/2005 |
| CN | 101046720 | 10/2007 |
| CN | 101427468 | 5/2009 |
| CN | 101950224 | 1/2011 |
| CN | 102016780 | 4/2011 |
| CN | 201828892 | 5/2011 |
| CN | 102138120 | 7/2011 |
| CN | 102449583 | 5/2012 |
| CN | 102483673 | 5/2012 |
| EP | 2073107 | 6/2009 |
| EP | 2128747 | 12/2009 |
| EP | 2267791 | 12/2010 |
| EP | 2315102 | 4/2011 |
| EP | 2315186 | 4/2011 |
| EP | 2357547 | 8/2011 |
| EP | 2413224 | 2/2012 |
| EP | 2418561 | 2/2012 |
| EP | 2420918 | 2/2012 |
| EP | 2508960 | 10/2012 |
| EP | 2660688 | 11/2013 |
| GB | 2313195 | 11/1997 |
| JP | 2007310539 | 11/2007 |
| JP | 2010244252 | 10/2010 |
| JP | 2014052997 | 3/2014 |
| WO | WO 97/018528 | 5/1997 |
| WO | WO 2011/156447 | 12/2011 |
| WO | WO 2012/031564 | 3/2012 |
| WO | WO 2012/160844 | 11/2012 |
| WO | WO 2013/083207 | 6/2013 |
| WO | WO 2014/018121 | 1/2014 |
| WO | WO 2014/124173 | 8/2014 |

OTHER PUBLICATIONS

Widdle, "Measurement of the Poisson's ratio of flexible polyurethane foam and its influence on a uniaxial compression model," International Journal of Engineering Science, vol. 46, 2008, pp. 31-49.

Bau, et al., "TeslaTouch: Electrovibration for Touch Surfaces," UIST'10, Oct. 3-6, 2010, New York, New York USA, 10 pages.

Feist, "Samsung snags patent for new pressure sensitive touchscreens," posted on AndroidAuthority.com at URL: http://www.androidauthority.com/samsung-patent-pressure-sensitive-touch-screens-354860, Mar. 7, 2014, 1 page.

* cited by examiner

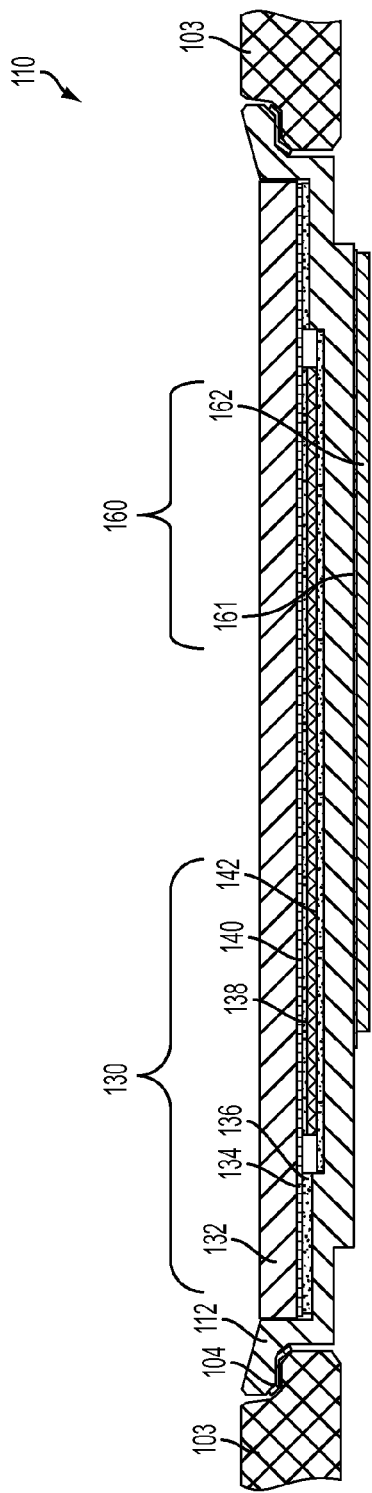
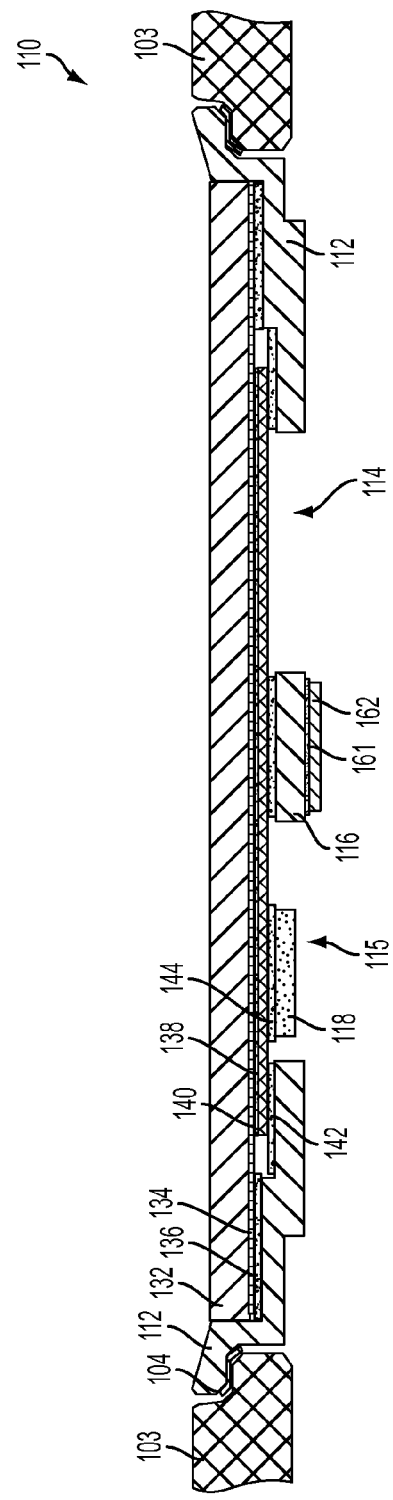

INPUT MEMBER WITH CAPACITIVE SENSOR

CROSS-REFERENCE TO RELATED APPLICATION

This application claims the benefit under 35 U.S.C. §119(e) of U.S. Provisional Patent Application No. 61/858,606, filed Jul. 25, 2013, entitled "Input Member With Capacitive Sensor," the entirety of which is incorporated herein by reference as if fully disclosed herein.

TECHNICAL FIELD

The present invention relates generally to electronic devices, and, more specifically, to input members with capacitive sensors for use in electronic devices.

BACKGROUND

Electronic devices in use today typically require input from a user in order to, for example, turn the electronic device on or complete some operation. A variety of different mechanisms are in place for receiving input from the user, such as a mechanical button. A mechanical button typically includes a body that is depressed by the user in order to complete an electrical circuit or otherwise trigger a reaction from the device. A restoring force then restores the button back to its original, non-depressed position, until the body is again depressed. Mechanical buttons such as these, however, typically consume a large amount of space in today's ever-slimming electronic devices. Furthermore, mechanical buttons such as these usually allow only for a binary output—indicating that the button is either depressed or is not depressed—and do not provide a smooth, continuous response. Such a smooth, continuous response is usually precluded by the structure of mechanical buttons as the depressed button either completes an electrical circuit or does not complete the circuit.

SUMMARY

In one aspect, an electronic button can include a first circuit configured to capture a fingerprint of a user's finger placed on the electronic button, and a second circuit configured to sense a force applied to the electronic button by the user's finger. In some embodiments, the first circuit is further configured to provide temperature information to compensate for temperature sensitivities of the second circuit, and the second circuit is further configured to provide force information to the first circuit. The first circuit may be configured to determine when to sense a fingerprint based on the force information provided by the second circuit. Additionally or alternatively, the first circuit can be configured to correct the captured fingerprint responsive to the sensed force being greater than a predefined acceptable force for fingerprint capture.

In other embodiments, the temperature information is provided to a third circuit, the third circuit being configured to correct the sensed force using the temperature information.

Additionally or alternatively, a third circuit configured to combine an orientation of the captured fingerprint and the sensed force to provide three dimensional control of an electronic device.

In another aspect, a method of operating an electronic button includes sensing a force applied to the electronic button using a force sensor, and correcting the sensed force using a temperature measurement. A fingerprint sensor is configured to trigger the force sensor to sense the force responsive to human skin being detected by the fingerprint sensor. The force sensor may be further configured to trigger capturing a fingerprint responsive to sensing a predefined level of force applied to the electronic button. In some embodiments, a user is notified when the sensed force exceeds a predefined level of force at which a fingerprint can be properly captured.

In yet another aspect, an electronic device includes an electronic button, where the electronic button includes a rigid body defining a beam and at least one opening adjacent the beam, and a strain gauge coupled to the rigid body. At least one portion of the strain gauge is mounted to the beam and sensitive to strain applied to a longitudinal axis of the beam. In some embodiments, the electronic device also includes a capacitive fingerprint sensor configured to provide a temperature measurement to correct measurements from the strain gauge.

BRIEF DESCRIPTION OF THE DRAWINGS

FIG. 6A is a cross-sectional view of the electronic button of the electronic device in FIG. 1A, taken along line H-H of FIG. 1A;

FIG. 6B is another cross-sectional view of the electronic button of the electronic device in FIG. 1A, taken along line V-V of FIG. 1A;

DETAILED DESCRIPTION

Figure 1A:
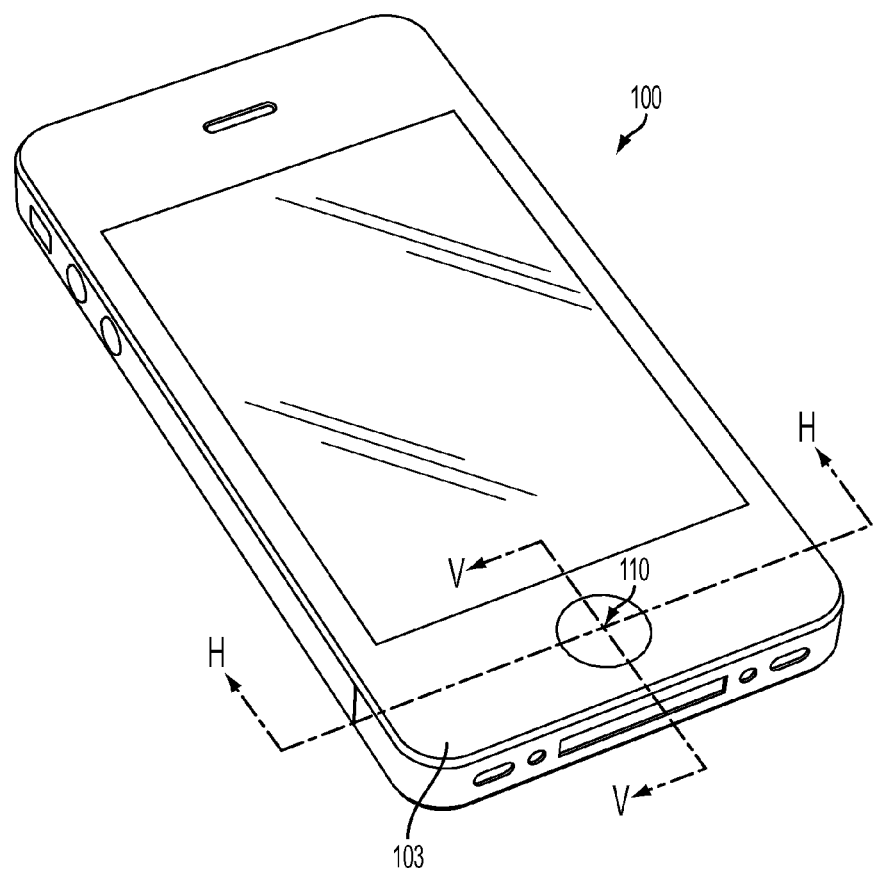
FIG. 1A is a front view of an electronic device including an electronic button.

Embodiments of an input member with a capacitive sensor, such as an electronic button, are described herein. FIG. 1A is a front view of an electronic device 100 including one or more electronic buttons 110. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more components typical of a computing or electronic device, such as, but not limited to, one or more processors, memory components, network interfaces, displays, cameras, and so on.

The electronic button 110 allows a user to interact with the electronic device 100. For example, the electronic button 110 may turn the electronic device 100 on, allow a user to perform some action such as returning to a home screen, and the like. The electronic device 100 may include more than one electronic button 110 in some embodiments, or may include only a single electronic button 110. The electronic device 100 may also include other input mechanisms, such as a mechanical button, multi-touch capacitive sensing display screen, one or more input/output ports, and so forth.

The electronic button 110 may in some embodiments be mechanically decoupled (e.g., isolated) from a housing 103 that surrounds the button 110 on one or more sides of the electronic button 110, or be decoupled from another part of the body of the electronic device 100. In other embodiments, the electronic button 110 may not be mechanically decoupled from the housing 103 or body (e.g., may be mechanically coupled to the housing 103), or may only be partially decoupled from the housing 103 or body. For example, in some embodiments, the housing 103 may be a glass plate, in which case one or more portions of the electronic button 110 may be integral with the glass plate.

As mentioned above, although not explicitly shown in FIG. 1A, the electronic device 100 may include a number of internal components, such as one or more processors, a storage or memory component, an input/output interface, a power source, and one or more sensors. The one or more processors may control operation of the electronic device 100 (including the electronic button 110 as described herein), and may individually or collectively be in communication with substantially all of the components of the electronic device 100. The processor may be any electronic device cable of processing, receiving, and/or transmitting instructions. As described herein, the term "processor" is meant to encompass a single processor or processing unit, multiple processors, or multiple processing units, or other suitably configured computing element.

Figure 1B:
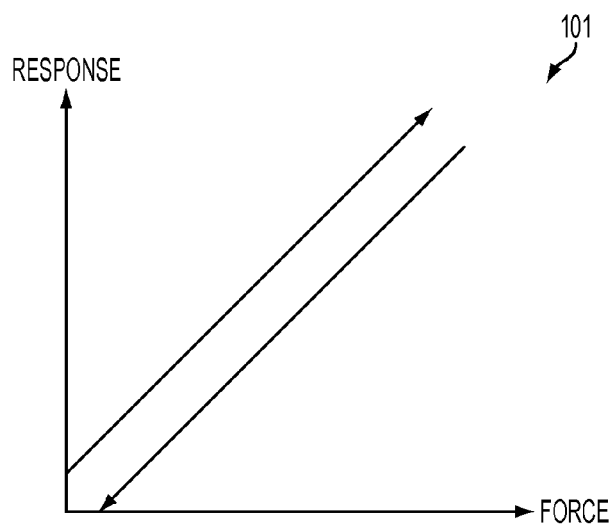
FIG. 1B is a graph showing a continuous response that may be provided by the electronic button of the electronic device of FIG. 1A.

FIG. 1B illustrates a graph demonstrating the response of an electronic button, such as the electronic button 110 illustrated in FIG. 1A, that has a continuous response to varying levels of force applied to the button. As used herein, continuous refers to a measurement that can take more than two values—for example, a measurement of force that can take one of five, ten, twenty, fifty, a hundred, a thousand, or tens of thousands of different values. The electronic button 110 in FIG. 1A may have a continuous response to applied forces, as compared with a mechanical button, which may only be on or off.

Figure 2:
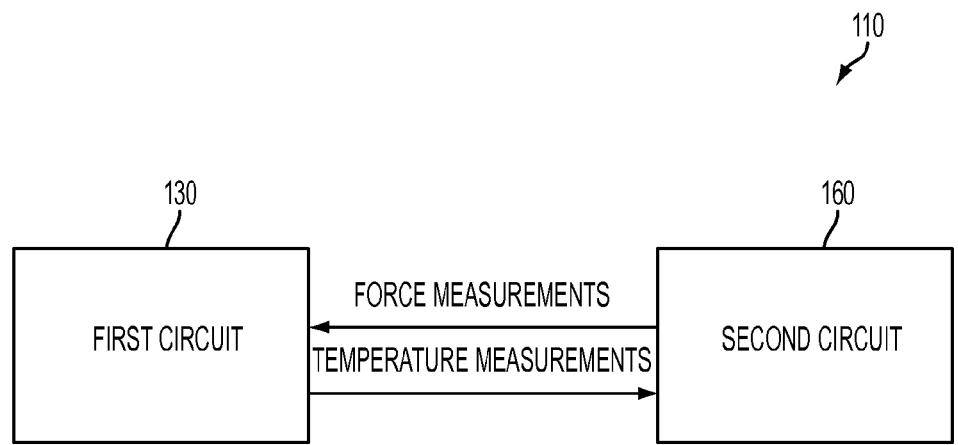
FIG. 2 is a simplified block diagram of the electronic button of the electronic device in FIG. 1A.

FIG. 2 is a simplified block diagram of one embodiment of the electronic button 110 of the electronic device 100 in FIG. 1A. The electronic button 110 in FIG. 2 includes a first circuit 130 and a second circuit 160. The first circuit 130 may be configured to capture a fingerprint of a user's finger placed on the electronic button 110. The first circuit 130 may include, for example, a capacitive fingerprint sensor. The first circuit 130 may also include one or more temperatures sensors embedded within or positioned external to the first circuit.

The second circuit 160 may be configured to sense a force applied to the electronic button 110 by the user's finger. The second circuit 160 may include, for example, a strain gauge, a capacitive gap sensor, and so forth. In some embodiments, such as when the second circuit 160 is a strain gauge, the second circuit 160 may be susceptible to temperature variations such that the force measurements provided by the second circuit 160 depend not only on the displacement of the electronic button 110, but also on the ambient temperature around the second circuit 160 or on the temperature of the components of the second circuit 160 themselves. The temperature of the components of the second circuit 160 may change in some embodiments as a result of, for example, the heat from a user's finger and/or the heat from the first circuit 130 operating, if the first and second circuits 130, 160 are positioned in proximity to one another.

In some embodiments, and as illustrated in FIG. 2, the first circuit 130 may be configured to provide temperature information to compensate for temperature sensitivities of the second circuit 160. This information may be used by the second circuit 160 to compensate for the temperature dependency of the force measurements. In some examples, the temperature information from the first circuit 130 may be provided to a third circuit (not illustrated in FIG. 2). Such a third circuit may also receive the raw force measurement from the second circuit 160, and may correct such raw force measurements using the temperature information. In other words, while the temperature information from the first circuit 130 may in some examples be provided directly to the second circuit 160 for the second circuit 160 itself to correct for the temperature dependency of the force measurements, in other examples, the temperature information from the first circuit 130 may be combined with the raw force information from the second circuit 160 in a separate, third circuit, such as a processor, to correct for the temperature distortions.

As also illustrated in FIG. 2, the second circuit 160 may be configured to provide force information to the first circuit 130 in some embodiments. The force information from the second circuit 160 may be fedback to the first circuit 130 in order to better understand a fingerprint captured by the first circuit 130. For example, if a user applies a relatively large amount of force to the electronic button 110, the fingerprint captured by the first circuit 130 may be distorted, or otherwise different than if the user had applied a normal amount of force. Similarly, if not enough force is used to press the electronic button 110, the ridges and valleys of the fingerprint may not be properly captured by the fingerprint button 110. The first and second circuits 130, 160, optionally together with a third circuit (not shown), can thus work together to allow a shallower electronic button 110 to be used in an electronic device 100 in place of a conventional mechanical button. The feedback between the first and second circuits 130, 160 of the electronic button 110 enables the cooperation of the first and second circuits 130, 160.

Figure 3A:
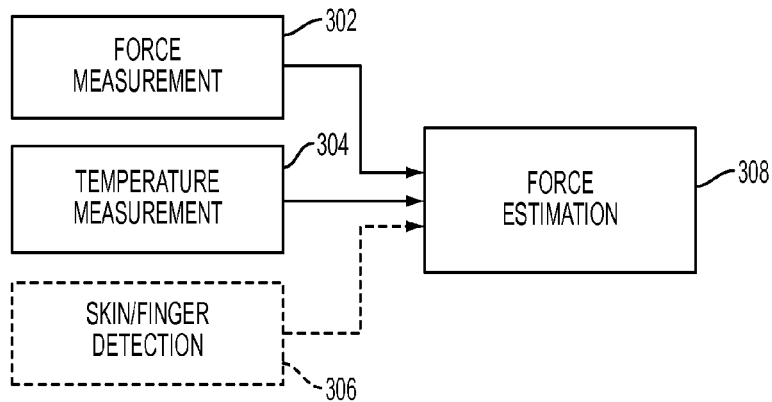
FIGS. 3A-3C are simplified flow diagrams illustrating several uses of the electronic button of the electronic device in FIG. 1A.
Figure 3B:
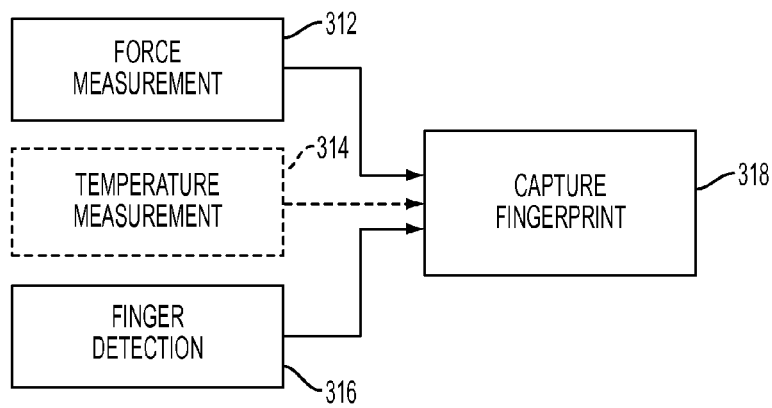
Figure 3C:
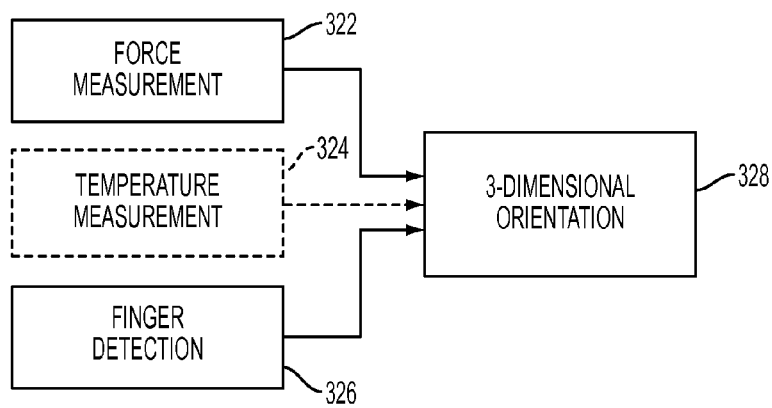

Turning now to FIGS. 3A through 3C, flowcharts are shown illustrating a few examples of how the electronic button 110 may be used in operation.

With reference to FIG. 3A, the electronic button 110 may in some examples be configured to estimate an actual force applied to the electronic button 110. Specifically, the force measurement 302 from the second circuit 160 may be combined with the temperature measurement 304 from the first circuit 130 in order to provide an estimated force 308 with which the electronic button 110 was depressed. Using the estimated force 308, the electronic button 110 may be able to correct a fingerprint captured using the first circuit 130 if, for example, the sensed force 302 is greater than a predefined acceptable force for fingerprint capture, as also explained in more detail below.

In some embodiments, and still with reference to FIG. 3A, the electronic button 110 may be configured to trigger the second circuit 160 to sense the force applied to the electronic button 110 responsive to human skin (e.g., a finger, palm, etc.) being detected by the first sensor 130. In order to conserve power, for example, the second circuit 160 may not continuously measure the force applied to the electronic button 110, but instead may only activate the sensing circuitry of the second circuit 160 if human skin or a finger is detected on the electronic button. In another embodiment, the second circuit 160 may continuously measure the force applied to the electronic button 110, but may signal a "click" to the electronic device 100 only in the event that a human finger or other portion of human skin is detected on the electronic button 110. This may reduce accidental activation of the electronic button 110, particularly when the electronic button 110 is not decoupled from one or more other portions of the electronic device 100, but also when the electronic button is decoupled from one or more other portions of the electronic device 100. This may reduce the likelihood that the electronic button 110 would signal a click activation if a pen in a user's pocket accidentally depresses the button. In still other embodiments, however, the second circuit 160 may continuously measure the force applied to the electronic button 110, and provide the same to the electronic device 100, regardless of whether human skin or a human finger is detected by the first circuit 130.

With reference to FIG. 3B, the electronic button 110 may in some examples be configured to determine when to sense a fingerprint based on the force information provided by the second circuit 160. Specifically, the force measurement 312 from the second circuit 160 may be combined with a finger detection indication 316 from the first circuit 130 to provide an indication 318 that triggers the first circuit 130 to capture the fingerprint of the user. In some examples, a temperature measurement 314 from the first circuit 130 may optionally be used during this process in order to, for example, correct the force measurement 312 provided by the second circuit 160 for temperature distortions.

In one example, if the force measurement 312 from the second circuit 160, as optionally corrected using the temperature measurement 314, is within a range of forces at which a fingerprint can be properly captured, the indication 316 may be provided to the first circuit 130 in order to capture the fingerprint. If, on the other hand, the force measurement 312 from the second circuit 160, as optionally corrected using the temperature measurement 314, is below a predefined level of force, the electronic button 110 may cause the electronic device 100 to request that the user try again, pressing more firmly on the electronic button 110. If, however, the sensed force 312 from the second circuit 160, as optionally corrected using the temperature measurement 314, exceeds a predefined level of force at which a fingerprint can be properly captured, the electronic button 110 may cause the electronic device 100 to request that the user try again, pressing less firmly on the electronic button 110.

In still other examples, the force measurements 312 may be used in other manners. For example, the force measurements 312 may be monitored such that when the force applied to the electronic button 110 is relatively stable (e.g., is not rapidly varying), the indication 318 is given to capture the fingerprint. Alternatively, the force measurement 312 may be used by the electronic button 110 to compensate for the effect of too much or too little force being used to press the button 110—for example, if too much force is used, and the force measurement 312 reflects this excess, an algorithm may be applied to a fingerprint that is nonetheless captured by the first circuit 130 in order to compensate for the distortions in the captured fingerprint caused by the excess force. If, for example, the excess force causes the ridges of a fingerprint to be more spaced out and the valleys of a fingerprint to be wider, the force measurement 312 representative of the force applied to the electronic button 110 at that time may be used to adjust the width of the valleys and the spacing of the ridges.

In some embodiments, the force sensing accomplished by the second circuit 160 may consume less power and generate less heat than the fingerprint capturing of the first circuit 130, and thus it may be more economical to measure the force applied to the electronic button 110 at a relatively high sample rate, and only capture a fingerprint when a sufficient, but not excessive, force is applied to the electronic button 110. The first circuit 130 may nonetheless operate in a limited fashion, for example it may obtain and provide the temperature measurement 314 in order to adjust the force measurements 312 from the second circuit 160 during operation, without necessarily activating the components of the first circuit 130 that actually function to capture the fingerprint (e.g., the capacitive sensing aspects of the first circuit 130).

With reference to FIG. 3C, the electronic button 110 may in some examples be configured to provide a 3-dimensional orientation of a user's finger that is used to depress the electronic button 110. Specifically, the force measurement 322 from the second circuit 160 may be combined with a finger detection indication 326 from the first circuit 130 in order to provide the 3-dimensional orientation 328—e.g., the first circuit 130 may provide vertical and horizontal orientation of the finger using the fingerprint ridges and valleys, while the second circuit 160 may provide the depth aspect of the 3-dimensional orientation. The 3-dimensional orientation 328 provided by the electronic button 110 may be used, for example, to control the electronic device 100—such as controlling a character or other object in a game, or otherwise controlling the navigation within the electronic device 100.

Figure 4:
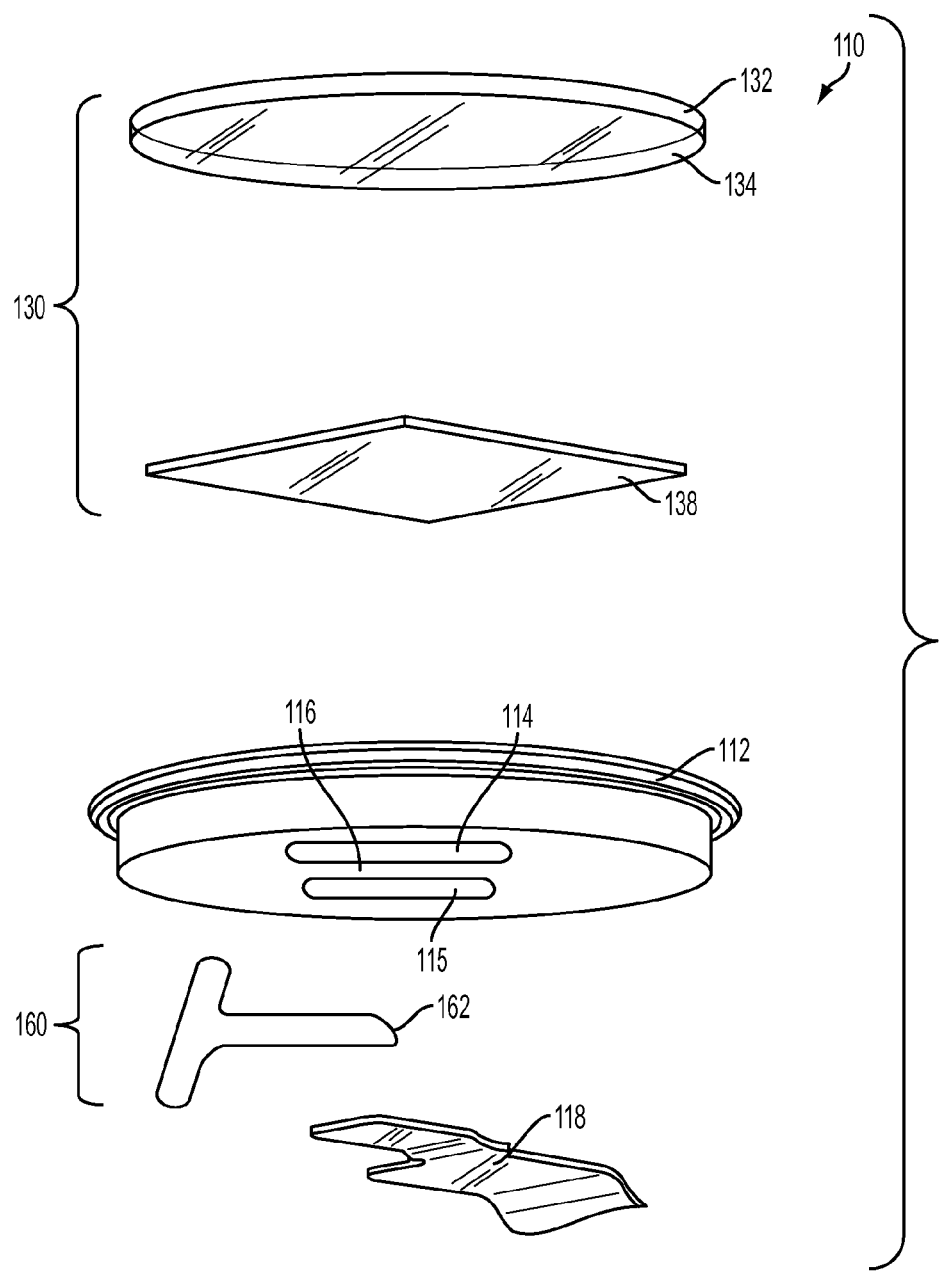
FIG. 4 is an exploded view of one embodiment of the electronic button of the electronic device in FIG. 1A.

With reference now to FIG. 4, an exploded view of one embodiment of an electronic button 110 is shown. The electronic button 110 includes a first circuit 130 and a second circuit 160, similar to those shown in FIG. 2 and described above.

The first circuit 130 includes a cylindrical member 132, which may include sapphire, glass, and so forth. The cylindrical member 132 may include a layer of ink 134 positioned on the bottom of the cylindrical member 132. The first circuit 130 also includes a capacitive fingerprint sensor 138, which may be embodied in a silicon die with circuitry for detecting and capturing a fingerprint, circuitry for sensing human skin, temperature sensors, and so forth.

The electronic button 110 also includes a second circuit 160, which may include a strain gauge 162. The strain gauge 162 may generally define a T-shape, and may in some embodiments include four gauge components 164, 165, 166, 167, as explained in more detail below. The four gauge components 164, 165, 166, 167 may together form a full-bridge, in order to thermally and electrically match the strain gauge 162.

The electronic button also includes trim 112, which may generally have a ring shape, and may be coupled between the first and second circuits 130, 160. The trim 112 may be a rigid body (comprised, for example, of stainless steel or another hard material), and may define a beam 116 and one or more openings 114, 115 adjacent the beam. As illustrated in FIG. 4, the capacitive fingerprint sensor 138 may be positioned on an opposite side of the trim 112 from the strain gauge 162, as described in more detail below with reference to FIG. 6A, in order to provide thermal insulation and/or electrical shielding between the strain gauge 162 and the capacitive fingerprint sensor 138.

The electronic button 110 may also include a flex circuit 118 configured to be coupled to the first and second circuits 130, 160, and to route signals from the first and second circuits 130, 160 to a processor or other portion of the electronic device 100.

As illustrated in FIG. 4, the electronic button 110 may be mechanically decoupled from a housing 103 surrounding the electronic button 110; however in other embodiments, one or more components of the electronic button 110 (e.g., cylindrical member 132) may be integral with the housing 103 of the electronic device 100.

Figure 5:
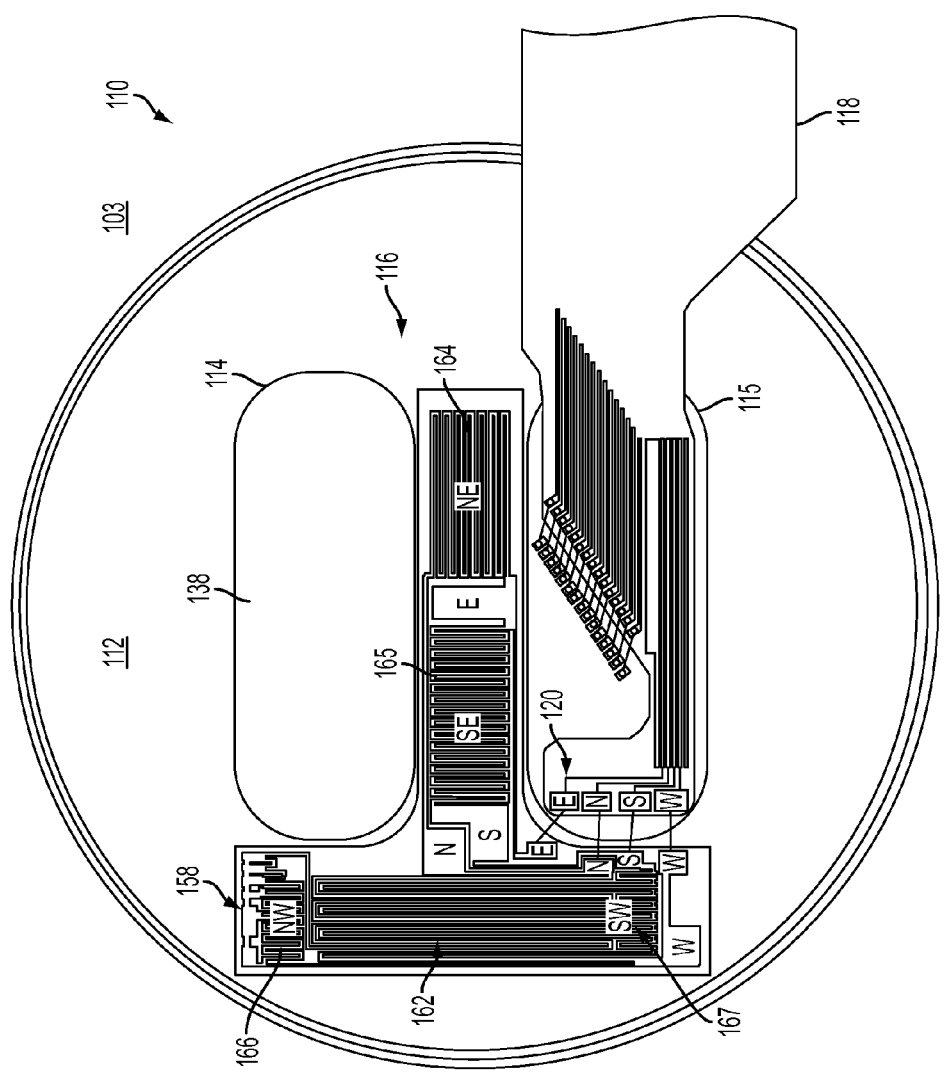
FIG. 5 is a bottom view of the electronic button of the electronic device in FIG. 1A.

With reference to FIG. 5, which is a bottom view of the embodiment of an electronic button 110 shown in FIG. 4, the strain gauge 162 of the second circuit 160 may be coupled to the rigid body of the trim 112. More specifically, in one example, an elongated trunk of the T-shaped strain gauge 162 including NE and SE gauge components 164, 165 may be mounted to the beam 116 of the trim 112. One or more of the NE, SE gauge components 164, 165 may be sensitive to strain applied to a longitudinal axis of the beam. In this example, NE gauge component 164 may be sensitive to strain applied to the longitudinal axis of the beam, whereas SE gauge component 165 may be sensitive to strain applied to the vertical axis of the beam. Due to their proximity to one another and their common location on the beam 116, the NE gauge component 164 and the SE gauge component 165 may both be subject to similar temperature variations. Thus, the NE gauge component 164 is sensitive to strain applied along the horizontal axis of the beam 116 and also to temperature variations, while the SE gauge component 165 is not sensitive to strain applied along the horizontal axis of the beam 116 but is sensitive to temperature variations. Signals generated by the SE and NE gauge components 164, 165 can thus be combined in order to provide a first level of temperature correction, however the temperature sensors in the first circuit 130 can further be used to compensate for the temperature sensitivities of the strain gauge 162.

Still with reference to FIG. 5, NW and SW gauge components 166, 167 of the strain gauge 162 may also be coupled to the rigid body of the trim 112, but they may not be sensitive to displacement of the electronic button 110. Instead, the NW, SW gauge components 166, 167 may be used to electrically match the NE, SE gauge components 164, 165.

As mentioned above, the trim 112 may include one or more openings 114, 115, which may facilitate communication of signals between the strain gauge 162 and the capacitive fingerprint sensor 138, and also may allow a single flex circuit 118 to be used to route signals from both the strain gauge 162 and the capacitive fingerprint sensor 138 to another location of the electronic device 100, such as a processor. As illustrated for example in FIG. 5, a plurality of through silicon vias (TSVs) 120 of the capacitive fingerprint sensor 138 may be positioned near one of the openings 115 in the trim 112, such that signals E, N, S, W from the strain gauge 162 may be provided to the capacitive fingerprint sensor 138 and also to the flex circuit 118. Signals from the capacitive fingerprint sensor 138 may also be provided to the strain gauge 162 and/or to the flex circuit 118 through the one or more openings 114, 115, as shown in FIG. 5. In other words, the flex circuit 118 may be coupled to the capacitive fingerprint sensor 138 through the opening 115 of the trim 112 and also coupled to the strain gauge 162.

As illustrated in FIG. 5, one or more components of the strain gauge 162 may be adjusted. For example, region 158 in FIG. 5 illustrates a region 158 where one or more strain gauge 162 components can be laser trimmed in order to provide electrical matching between two or more portions of the strain gauge, in order for the strain gauge to properly function as a full bridge with good cancellation. The region 158 may be trimmed after the strain gauge 162 is mounted to the trim 112 in some examples.

As also illustrated in FIG. 5, in some examples, the NW, SW gauge components 166, 167 may be interdigitated in order to increase the thermal and strain matching.

FIG. 6A illustrates a cross-sectional view of the electronic button 110 shown in FIGS. 4 and 5, taken along line H-H of FIG. 1A, and FIG. 6B illustrates a cross-sectional view of the electronic button 110 shown in FIGS. 4 and 5, taken along line V-V of FIG. 1A. With reference to both FIGS. 6A and 6B, the cylindrical member 132 and ink layer 134 are coupled to the trim 112 via adhesive 136. The ink layer 134 is also coupled to the capacitive fingerprint sensor 138 through adhesive 140, and the capacitive fingerprint sensor 138 is coupled to the trim 112 through adhesive 142. The strain gauge 162 is coupled to the beam 116 of the trim 112 through adhesive 161. Also, flex circuit 118 is coupled to one or more TSVs of the capacitive fingerprint sensor 138 through adhesive 144, and trim 112 is moveable within housing 103 via shim member 104.

As can be seen in FIGS. 6A and 6B, the trim 112 allows some separation between the capacitive fingerprint sensor 138 and the strain gauge 162. Such separation may provide a thermal buffer and/or an electrostatic shield between the capacitive fingerprint sensor 138 and the strain gauge 162. The trim 112, however, provides stiffness, with the beam 116 dissipating some of the pressure applied to the electronic button 110, and the openings 114, 115 in the trim facilitating communication of signals and measurements between the first and second circuits 130, 160.

Figure 7:
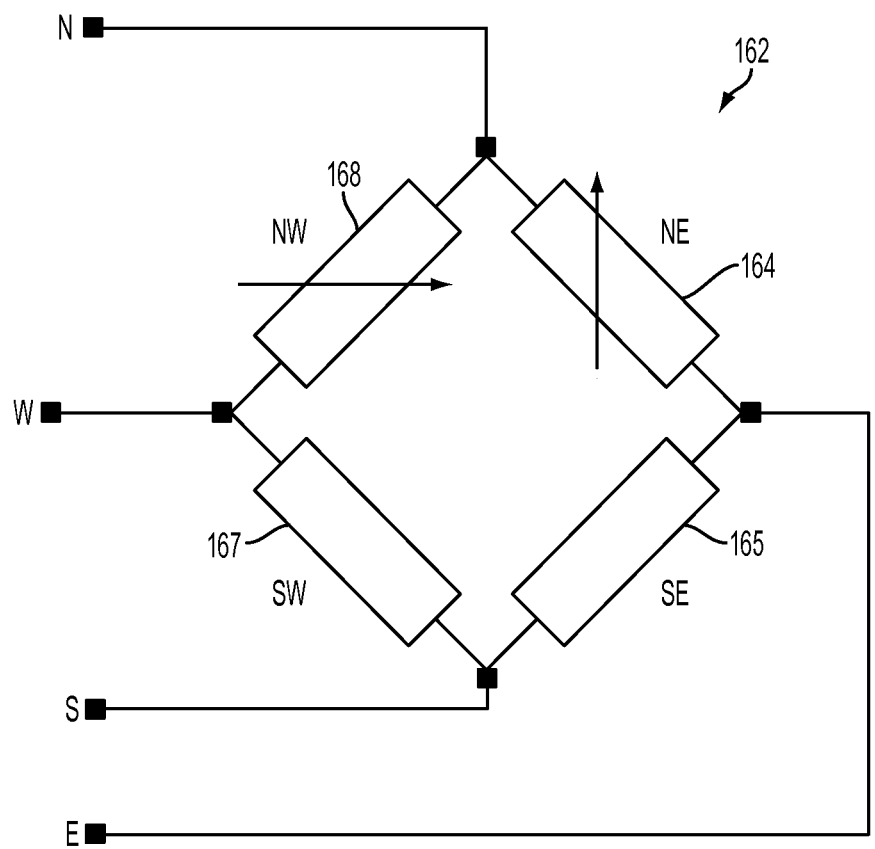
FIG. 7 is a simplified schematic view of a strain gauge of the electronic button of the electronic device in FIG. 1A.

FIG. 7 illustrates a full bridge, including all of the NE, SE, SW, NW components 164, 165, 166, 167 of the strain gauge 162. The full bridge strain gauge 162 provides many benefits, including helping eliminate errors due to the flex circuit 118 and wire or trace bond connection resistances. In other embodiments, however, a quarter or half bridge could be used with a single or only two components of a strain gauge 162, in which case the first circuit can still provide temperature correction information in order to correct the temperature dependency of the measurements of force by the strain gauge 162.

Figure 8:
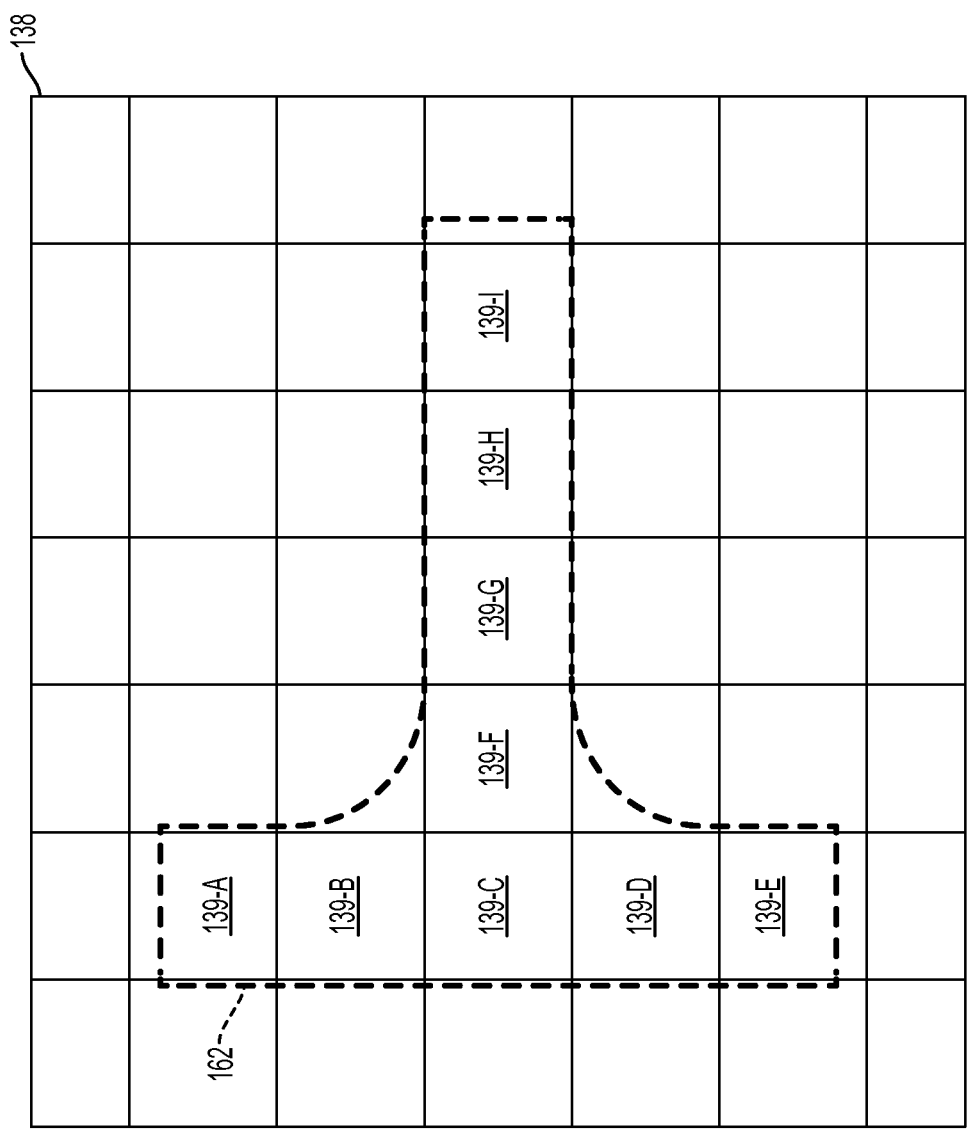
FIG. 8 is a simplified schematic view of a capacitive fingerprint sensor of the electronic button of the electronic device in FIG. 1A.

FIG. 8 illustrates a top view of a capacitive fingerprint sensor 138 of the first circuit 130, with a plurality of different quadrants 139-A, 139-B, 139-C, 139-D, 139-E, 139-F, 139-G, 139-H, 139-I. In some embodiments, each of the plurality of quadrants 139-A, 139-B, 139-C, 139-D, 139-E, 139-F, 139-G, 139-H, 139-I includes one or more temperatures sensors.

The layout of the capacitive fingerprint sensor 138 may be such that its various components are arranged in order to provide a substantially uniform temperature gradient of the capacitive fingerprint sensor adjacent the beam 116 of the trim 112. So, for example, relatively "cool" digital components of the capacitive fingerprint sensor 138 may be positioned in quadrants 139-F, 139-G, 139-H, and 139-I so that the temperature gradient along those quadrants is minimized. In another example, the "warm" analog components of the capacitive fingerprint sensor 138 may be evenly distributed among quadrants 139-F, 139-G, 139-H, and 139-I in order to reduce the temperature gradient therealong.

Minimizing the temperature gradient along the NE and SE components 164, 165 of the strain gauge 162 may allow the SE component 165 to better cancel out the thermal dependency of the NE component 164, because both SE, NE components 164, 165 will be subjected to similar thermal conditions. If, on the other hand, quadrants 139-F and 139-G were much warmer or much cooler than quadrants 139-H, 139-I, the effectiveness of the thermal cancellation between the NE and SE components 164, 165 of the strain gauge 162 may be reduced.

As mentioned above, and with reference still to the quadrants 139-A, 139-B, 139-C, 139-D, 139-E, 139-F, 139-G, 139-H, 139-I illustrated in FIG. 8, one or more temperature sensors may be included in each of the quadrants quadrants 139-A, 139-B, 139-C, 139-D, 139-E, 139-F, 139-G, 139-H, 139-I in order to, for example, measure and correct for any temperature gradient that nonetheless exists in the capacitive fingerprint sensor 138.

Figure 9:
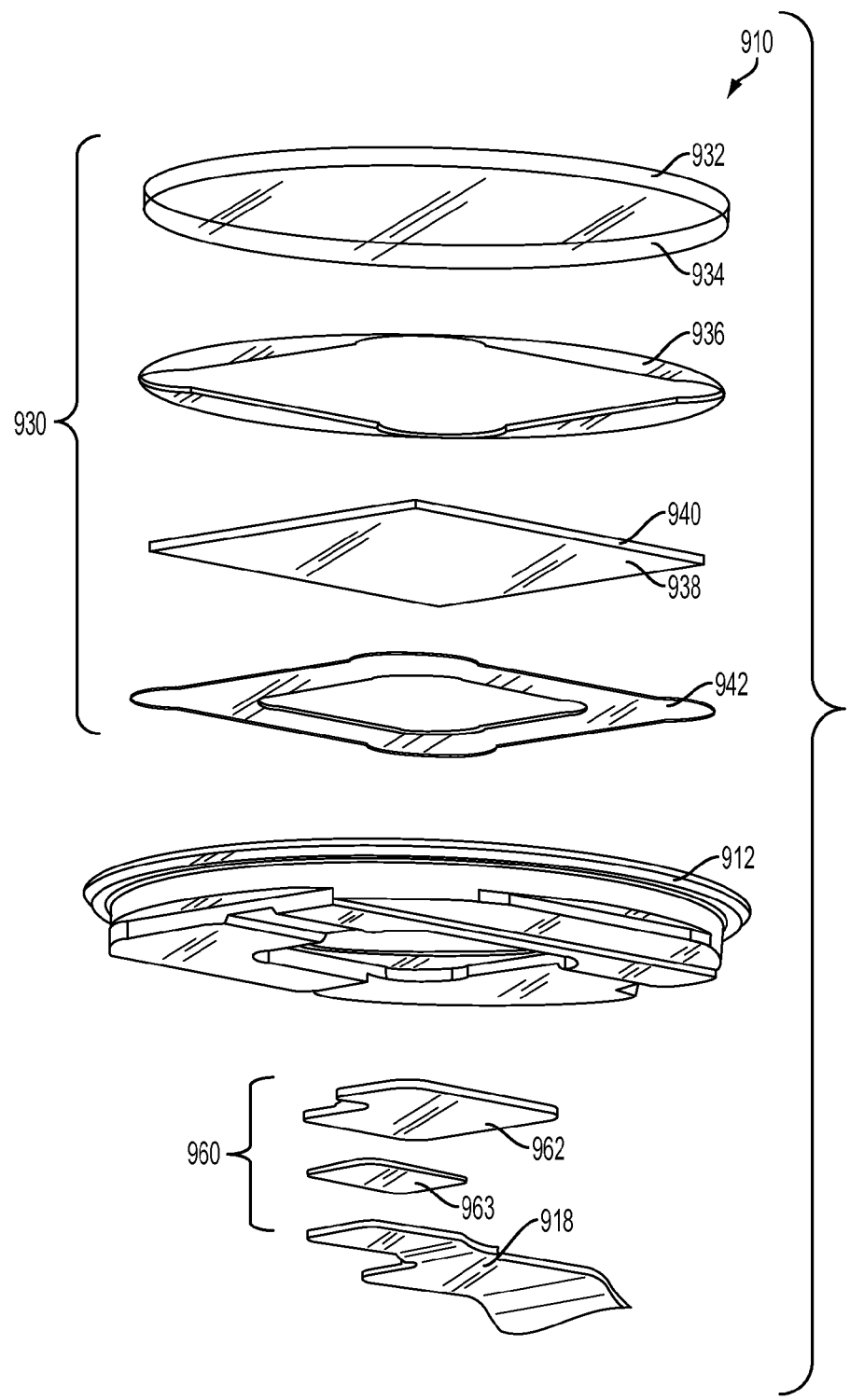
FIG. 9 is an exploded view of a second embodiment of the electronic button of the electronic device in FIG. 1A.
Figure 10:
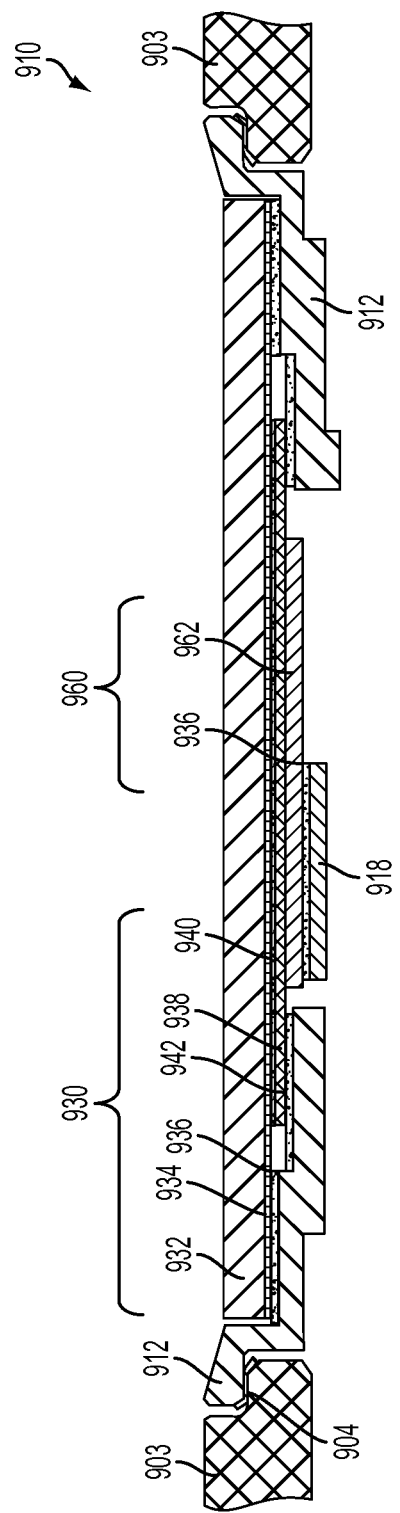
FIG. 10 is a cross-sectional view of the electronic button of the second embodiment of the electronic button shown in FIG. 9.

With reference to FIGS. 9 and 10, another embodiment of an electronic button 910 is shown. The electronic button 910 illustrated in FIGS. 9 and 10 is similar to the electronic button 110 shown and described above, except that the strain gauge 962 is mounted directly to the capacitive fingerprint sensor 938.

Figure 11:
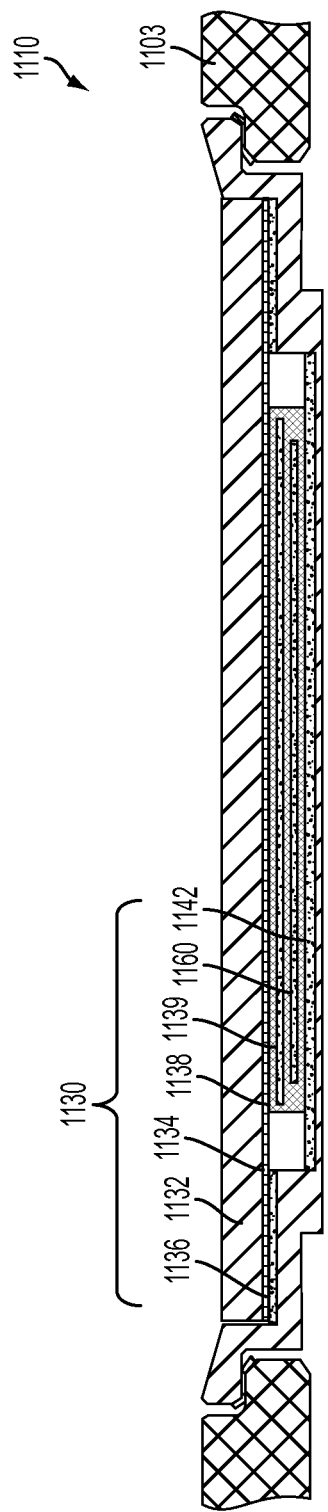
FIG. 11 is an exploded view of a third embodiment of the electronic button of the electronic device in FIG. 1A.

With reference to FIG. 11, another embodiment of an electronic button 1110 is shown. The electronic button 1110 illustrated in FIG. 11 is similar to the electronic button 110 shown and described above, except that the second circuit 1160 (including the strain gauge, for example) is integrally included within a semiconductor die that also includes capacitive fingerprint sensor 1139. In this manner, a single semiconductor die can include circuitry for performing the functions of both the first and second circuits 130, 160 described above.

Figure 12:
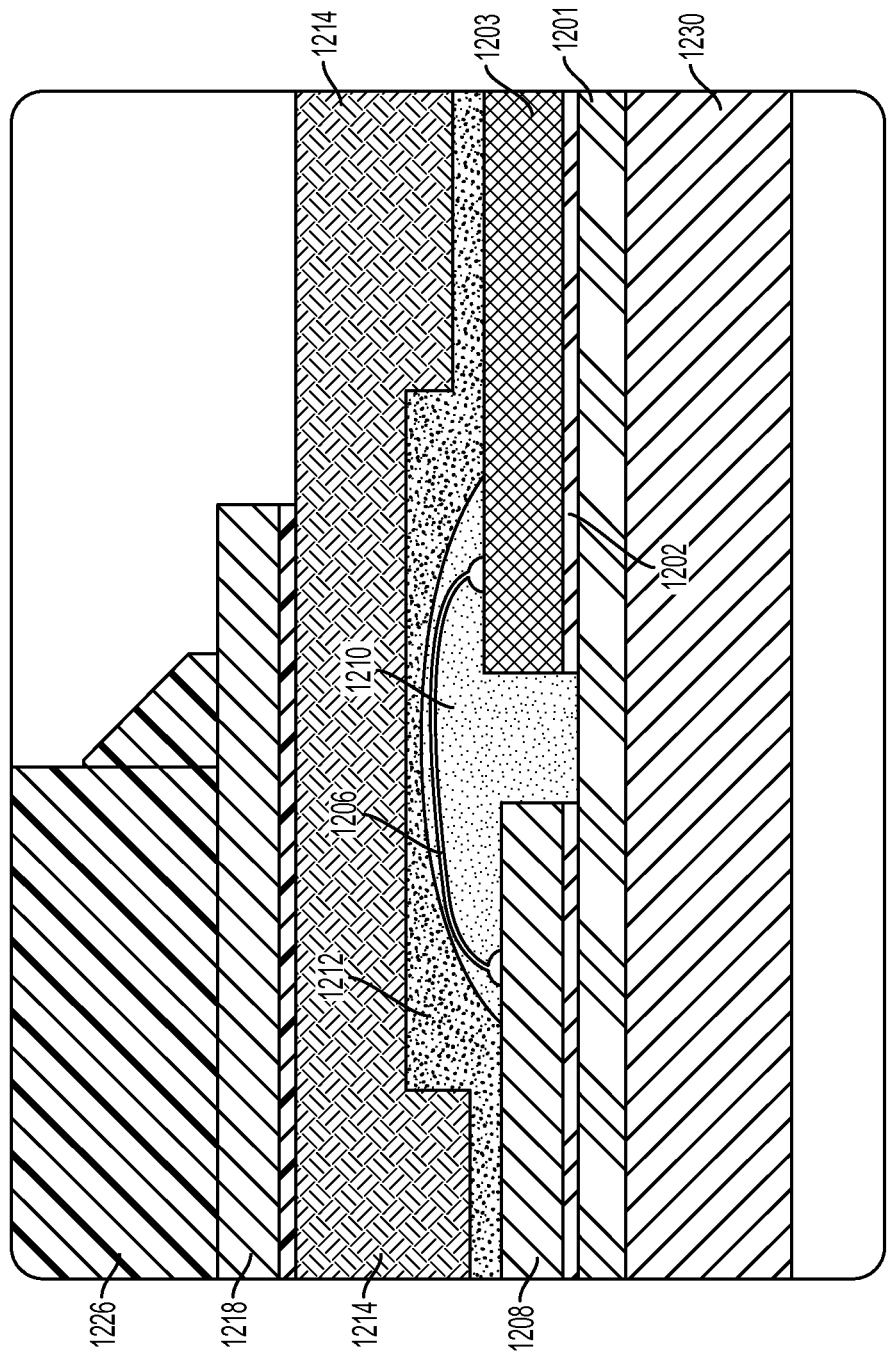
FIG. 12 is a cross-sectional view of another embodiment of an electronic button.

FIG. 12 illustrates another embodiment of an electronic button, with a stacked die configuration. It should be appreciated that the embodiment shown in FIG. 12 is oriented such that the exterior surface of the button (or other input element) is at the bottom of the figure.

The sensor circuit 1201 is shown bonded to a control circuit 1203 via bond 1202, which may be an adhesive. The sensor circuit 1201 may likewise be bonded to flex circuit 1208 by an adhesive or the like. As also shown, the sensor circuit may be positioned adjacent the button, which may be generally cylindrical in shape (although this shape is not necessary).

Wire bonding 1206 connects the flex circuit 1208 to the control circuit 1203, and the wire bonding 1206 is encapsulated by rigid encapsulant 1210 and secondary compliant encapsulant 1212 to protect the wire bonding 1206. The wire bonding 1206 is seated underneath locally thinned stiffener 1214 (with respect to the orientation shown in FIG. 12), and a second flex circuit 1218 is positioned between stiffener 1214 and switch 1226. A complaint encapsulant may fill at least a portion of the space between the stiffener 1214 and one or more of the flex 1208, encapsulant 1210, and control circuit 1203. The stiffener may be locally thinned to form a cavity or depression in which the wire bond and/or rigid encapsulant may be at least partially located.

Figure 13A:
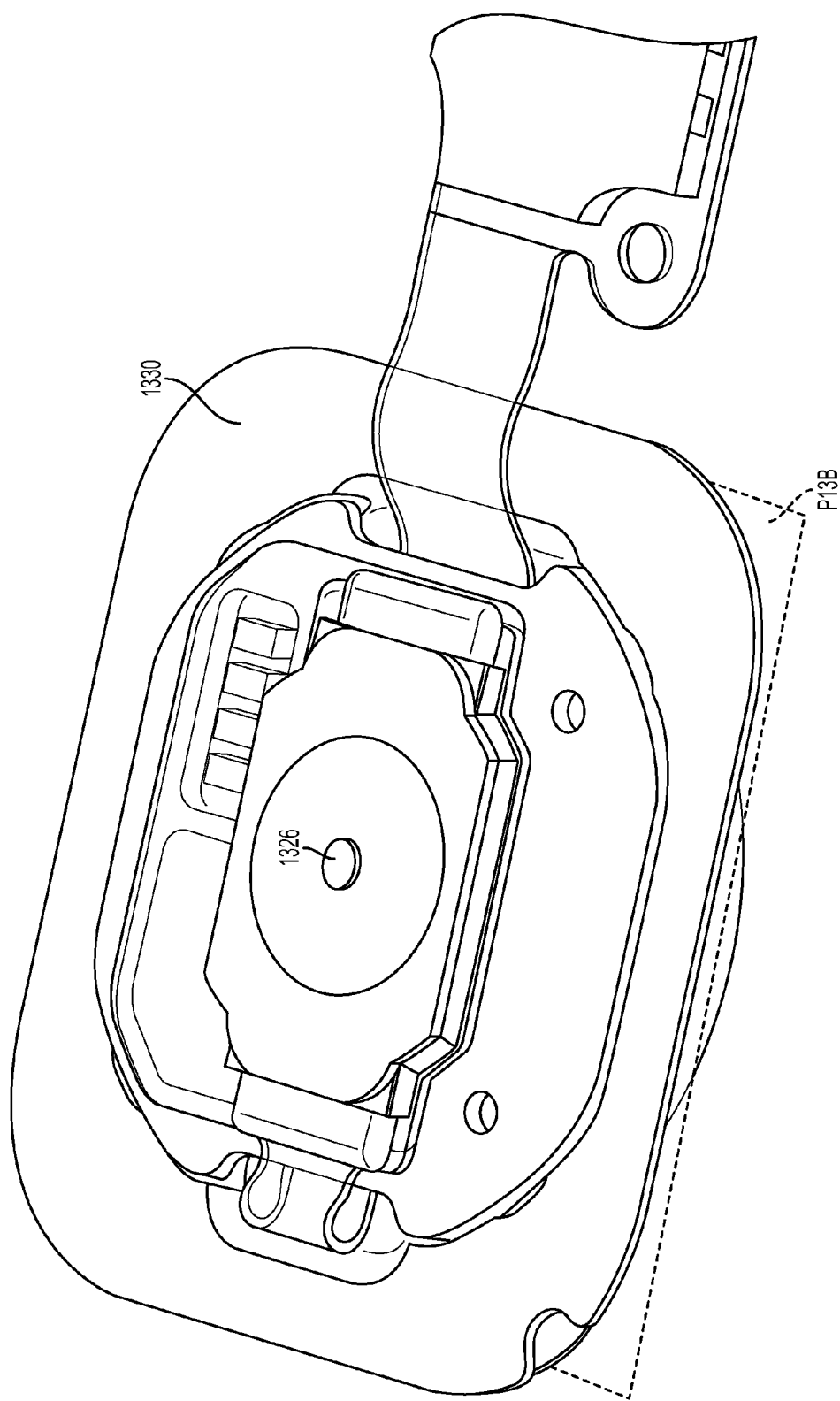
FIGS. 13A and 13B are perspective and cross-sectional views of a button assembly.
Figure 13B:
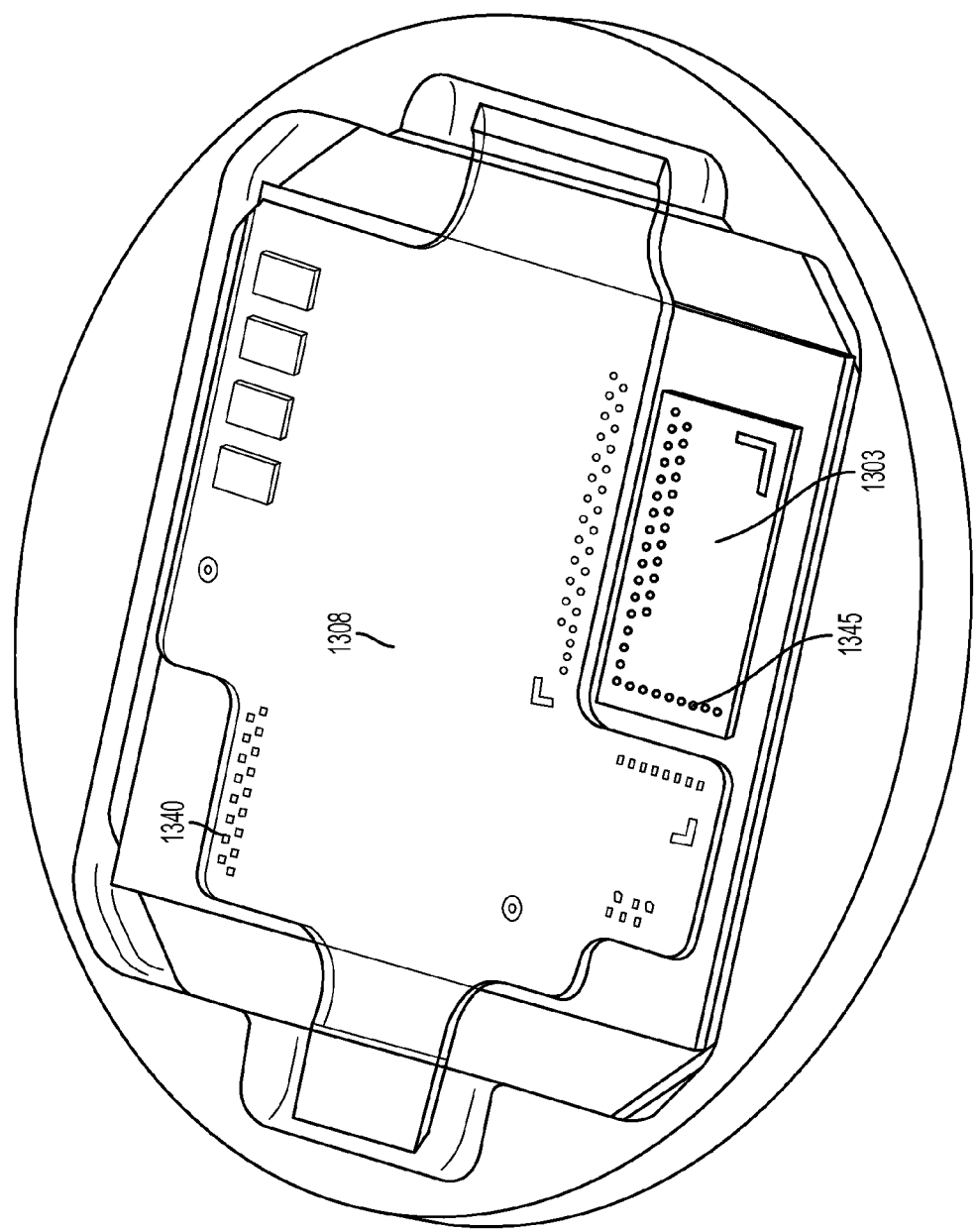

FIG. 13A illustrates a button assembly embodiment, with switch 1326 and trim 1330, and FIG. 13B is a corresponding cross-sectional representation taken along plane P13B in FIG. 13A. FIG. 13B illustrates sensor circuit to flex circuit wire bonds at 1340 and further sensor circuit to control circuit 1303 wire bonds at 1345. The sensor circuit to flex circuit wire bonds 1340 as disclosed in this embodiment carry signals to the underside of the die, where the wires are bonded to the flex circuit 1308 inset from the die perimeter.

The foregoing description has broad application. For example, while examples disclosed herein may focus on a strain gauge type of force sensing circuit, it should be appreciated that the concepts disclosed herein may equally apply to substantially any other type of force sensing circuit with or without appropriate modifications as would be appreciated by one skilled in the art of input members for electronic devices. Moreover, although certain examples have been described with reference to particular figures, it will be understood that other embodiments are also within the scope of this disclosure and the appended claims.

As another example of an alternate embodiment, in some examples a force concentrator may be coupled between the capacitive fingerprint sensor and the strain gauge, and may translate motion of the fingerprint sensor into deflection of the strain gauge, thereby indirectly causing strain. In this manner, strain can be applied in a localized area, which can allow for a very small strain gauge to be used, which may be more accurate and sensitive than a relatively larger strain gauge. This also may allow for thermal separation (e.g., air) between the capacitive fingerprint sensor and the strain gauge.

Accordingly, the discussion of any embodiment is meant only to be exemplary and is not intended to suggest that the scope of the disclosure, including the claims, is limited to these examples.

What is claimed is:

1. An electronic button, comprising:
   a first circuit configured to capture a fingerprint of a user's finger placed on the electronic button; and
   a second circuit configured to sense a force applied to the electronic button by the user's finger;
   wherein the first circuit is further configured to provide temperature information to compensate for temperature sensitivities of the second circuit, and the second circuit is further configured to provide force information to the first circuit.

2. The electronic button of claim 1, wherein the temperature information is provided to a third circuit, the third circuit being configured to correct the sensed force using the temperature information.

3. The electronic button of claim 1, wherein the first circuit is configured to determine when to sense a fingerprint based on the force information provided by the second circuit.

4. The electronic button of claim 1, wherein the electronic button is mechanically decoupled from a housing surrounding the electronic button.

5. The electronic button of claim 1, wherein the first circuit comprises a plurality of temperature sensors in a plurality of quadrants of the first circuit.

6. The electronic button of claim 1, wherein the first circuit is configured to correct the captured fingerprint responsive to the sensed force being greater than a predefined acceptable force for fingerprint capture.

7. The electronic button of claim 1, further comprising a third circuit configured to combine an orientation of the captured fingerprint and the sensed force to provide three dimensional control of an electronic device.

8. The electronic button of claim 1, wherein the second circuit is mounted directly on the first circuit.

9. The electronic button of claim 1, wherein the second circuit is integrally included within a semiconductor die that also includes the first circuit.

10. The electronic button of claim 1, wherein the first circuit comprises a capacitive fingerprint sensor and the second circuit comprises a strain gauge.

* * * * *